United States Patent
Mofrad

(10) Patent No.: US 12,496,450 B2
(45) Date of Patent: Dec. 16, 2025

(54) ANTIBIOTIC WAFER

(71) Applicant: Pirooz S. Mofrad, Bethesda, MD (US)

(72) Inventor: Pirooz S. Mofrad, Bethesda, MD (US)

(*) Notice: Subject to any disclaimer, the term of this patent is extended or adjusted under 35 U.S.C. 154(b) by 762 days.

(21) Appl. No.: 16/544,964

(22) Filed: Aug. 20, 2019

(65) Prior Publication Data

US 2021/0052907 A1    Feb. 25, 2021

(51) Int. Cl.
*A61N 1/375* (2006.01)
*A61K 9/00* (2006.01)
*A61K 39/00* (2006.01)
*A61B 5/00* (2006.01)
*A61N 1/372* (2006.01)

(52) U.S. Cl.
CPC ............ *A61N 1/37512* (2017.08); *A61K 9/00* (2013.01); *A61K 39/00* (2013.01); *A61N 1/3752* (2013.01); *A61N 1/3756* (2013.01); *A61B 5/0031* (2013.01); *A61N 1/37229* (2013.01)

(58) Field of Classification Search
CPC ............. A61N 1/37512; A61N 1/3752; A61N 1/3756; A61N 1/37229; A61N 1/372; A61K 9/00; A61K 39/00; A61K 9/7007; A61K 47/10; A61B 5/0031
See application file for complete search history.

(56) References Cited

U.S. PATENT DOCUMENTS

| | | | |
|---|---|---|---|
| 9,169,182 B2 | 10/2015 | Bewley et al. | |
| 9,174,839 B2 | 11/2015 | Abbott et al. | |
| 9,345,744 B2 | 5/2016 | Gourdie et al. | |
| 9,782,345 B2 | 10/2017 | Wirostko | |
| 9,848,955 B2 | 12/2017 | Buevich et al. | |
| 2009/0162301 A1* | 6/2009 | Tarrand | A01N 59/12 424/49 |
| 2017/0319756 A1* | 11/2017 | Pulapura | A61L 31/06 |

OTHER PUBLICATIONS https://www.merriam-webster.com/dictionary/coin retrieved on Oct. 4, 2022.*

* cited by examiner

*Primary Examiner* — Jessica Worsham
(74) *Attorney, Agent, or Firm* — Scott Houtteman; Houtteman Law, LLC

(57) ABSTRACT

An antibiotic wafer system to be used to reduce or eliminate post-operative infection in connection with implanting cardiac implantable electronic devices such as implantable defibrillators, permanent pacemakers, left ventricular assist devices. The wafers will be simpler and cheaper to manufacture than prior art pouches. The wafers will slowly deliver therapeutic antibiotic levels. Unlike prior systems which are only partially biodegradable, the wafer system is completely biodegradable and resorbable wafer mesh. The surgeon will find the post-operative wound closing easier because the wafer will occupy a reduced volume in the implantation pocket and around the implanted device.

10 Claims, 1 Drawing Sheet

ANTIBIOTIC WAFER

BACKGROUND

Since their introduction, Cardiac Implantable Electronic Devices (CIEDs), e.g. implantable defibrillators, permanent pacemakers, left ventricular assist devices; have provided important benefits. CIEDs have prevented fatal cardiac-related disorders in patients with a history of myocardial infractions. As the technology develops, CIEDs are used in a broader variety of conditions resulting in a decline in deaths caused by ischemic, myocardial, and cardiac rhythm.

With the increase in popularity, however, comes an increase in a serious complication, post-operative CIED infection. A National Hospital Discharge Survey shows that from 1996 to 2006 the number of hospitalizations for infected CIEDs jumped 320 percent. This jump outpacing the increase in deice implants. In 1996 2.6 percent of implants resulted in infection. In 2006 the rate rose to 5.8 percent.

Bacterial infection is responsible for the majority of CIED complications. The increase in admissions for CIED infection is 5-fold the increase in the number of CIED implantations. Increased rate of infection likely due to more patient comorbidities, longer times to perform in implantation procedure and the rise of drug resistant organisms.

The odds ratio for developing a CIED is shown in the table below.

|  | ODDS RATIO FOR DEVELOPING A CIED INFECTION |
| --- | --- |
| PATIENT PROCEDURES |  |
| Early Reintervention* | 15.04 |
| CRT-D vs IDD/PM | 7.57 |
| >2 Leads in Place | 5.41 |
| Device Replacement/Revision** | 3.67 |
| Temporary Pacing Wire | 2.46 |
| PATIENT MEDICATIONS |  |
| Corticosteroid Use *** | 13.90 |
| Oral Anticoagulant | 2.82 |
| PATIENT CHARACTERISTICS |  |
| Renal Failure | 11.97 |
| Fever <24 Hr. Prior to Implantation | 5.83 |
| Renal Insufficiency | 5.46 |
| Congestive Heart Failure | 2.57 |
| Male Gender | 2.23 |

*Early Reintervention: new procedure to manage non-infections complication before discharge
**Device Replacement/Revision: generator exchange or lead-related procedure involving opening the device pocket
*** Corticosteroid Use: >20 mg ≥ 1 month in preceding year Thus, three circumstances are particularly risky: early reintervention, corticosteroid use and renal failure.

There are considerable clinical and economic burdens associated with CIED Infections. Infection rates are increasing faster than CIED implant rates. Also, infection rates typically range from 0.6% to 4% but have been reported as high as 7%. Average hospital length of stay (LOS) ranges from 15.5 to 24.3 days. In-hospital patient mortality associated with a CIED infection ranges from 4.6% to 11.3%. Fifteen month patient mortality ranges from 27% to 35%. The average cost to treat a CIED infection is $146,000. Effective Oct. 1, 2012, Medicare and Medicaid do not reimburse hospitals for CIED infections acquired at the hospital.

PREVENTION

CIED infection can present as pocket site infection or systemic infection and can be difficult to diagnose. Pocket site infection can present with pain, skin inflammation, swelling and redness. Skin and soft tissue ulceration and drainage can also be present. But fever and other signs of systemic toxicity are frequently absent. Infective endocarditis may be present.

A diagnosis of pacemaker infective endocarditis is based on clinical parameters, blood cultures, and echocardiographic findings. The device may be salvaged in cases of noninfective hematoma or seroma.

There are steps that can be taken to reduce risk of infection post device implantation. Quality-control at the local institution, e.g. antiseptic techniques. Systemic antibiotic prophylaxis can significantly reduce CIED-related infections. Another step is patient education on proper wound care post-implant. Also, perioperative antibiotic infusion via intravenous during the procedure. Antibiotic washes of the wound site/device site prior to closure via sutures.

This specification discloses another risk reducing step, the use of a biodegradable antibiotic wafer system to be left in the wound site to deliver therapeutic effect for several weeks post-implant, discussed in more detail below.

ANTIBACTERIAL POUCH

Surprisingly, the only similar device now on the market is the antibacterial pouch, now in its second iteration. An antibacterial pouch is indicated for holding a pacemaker or implantable cardioverter-defibrillator (ICD) thereby creating a stable environment surrounding the device and leads after surgical placement. The biocompatible mesh is coated with antibiotics that elute (dissolve) within a 7 to 10 day period.

The antibacterial pouch is the first FDA-cleared combination drug plus device product designed to reduce infections associated with implantable pacemakers and/or ICDs, as demonstrated in preclinical in vitro and in vivo studies. It also stabilizes cardiac implantable electronic devices (CIEDs).

Multiple randomized clinical trials demonstrate that the minocycline/rifampin combination significantly reduces bacterial infections. The pouch is a dual component (resorbable and non-resorbable) sterile prosthesis constructed of open-pore weave, knitted filaments of a lightweight polypropylene mesh and coated with a resorbable polymer. The resorbable polymer carries two distinct antibiotics: (1) minocycline and (2) rifampin. Minocycline acts as a bacteriostatic, to inhibit protein synthesis. Rifampin acts as a bactericidal agent, to inhibit DNA-dependent RNA polymerase. Both minocycline and rifampin are impregnated into the resorbable polymer in concentrations of 86 µg/cm$^2$.

The resorbable polymer is resorbed by the body over the next approximately 140 days, leaving only the non-resorbable lightweight polypropylene mesh to hold and stabilize the device. The resorbable polymer is composed of nontoxic or naturally occurring materials. Each component of the polymer has a history of prior human use or human exposure as implants, IV injectables, or foods. Many of the polymer components are GRAS (generally regarded as safe). Once introduced into an aqueous environment, the polymer matrix absorbs water, beginning the process which drives degradation and elution.

The pouch has received $50 million investment and reports indicate an annual revenue of about $20 million. in revenue annually. The pouch manufacturer has recently been purchased for $160 million.

More than 40,000 units have been sold since approval and first implant in May of 2008 at Texas Heart Institute in Houston, Tx. The original version was only partially resorbed—leaving a capsule.

CIED INFECTION PATHOGENS & PROPHYLAXIS

Figure 1:
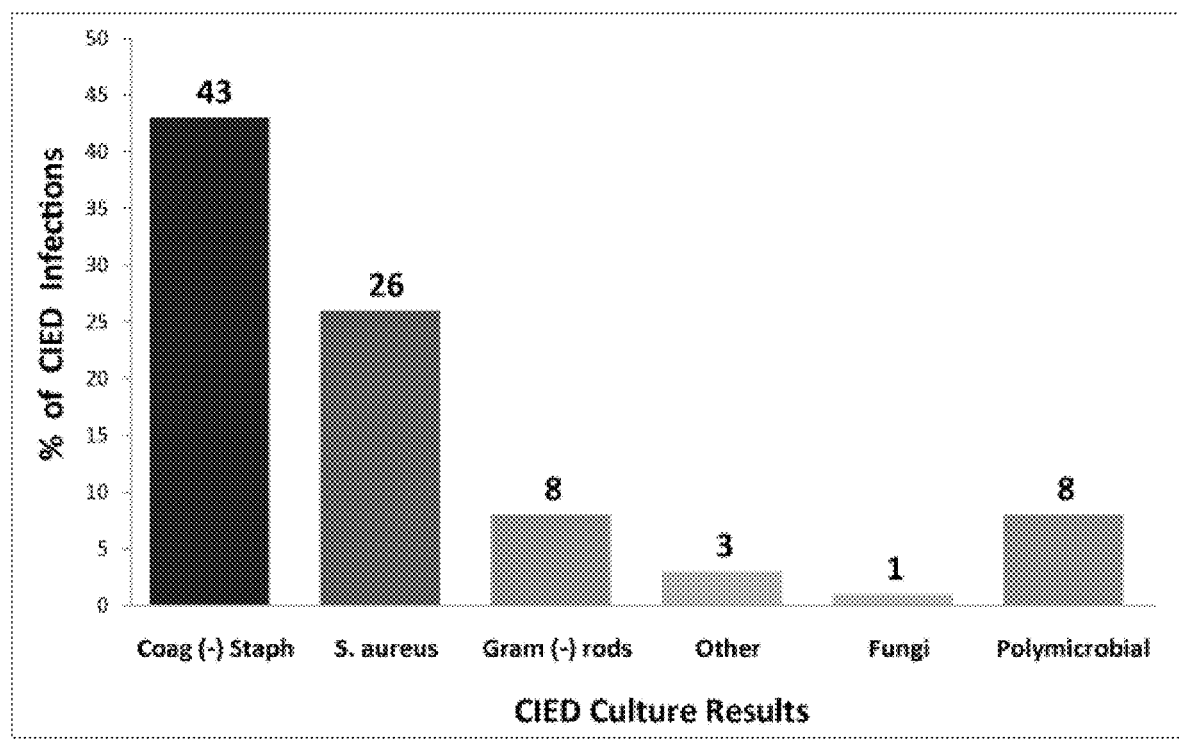
FIG. 1 is a comparison of CIED infection rates among various pathogens.

FIG. 1 illustrated the CIED infection rate of various pathogens. Coagulase (−) *Staphylococcus* (e.g. *S. epidermidis*) and *S. aureus* are responsible for about 70% of CIED infections. Nosocomial isolates of these pathogens are becoming increasingly resistant to methicillin, which is equivalent to cefazolin resistance.

In 2010 the American Heart Association (AHA) and the Heart Rhythm Society (HRS) issued guidelines for lowering the incidence of CIED infection. Prophylaxis with an antibiotic that has in vitro activity against staphylococci should be administered. If cefazolin is selected for use, then it should be administered intravenously within 1 hour before incision; if vancomycin is given, then it should be administered intravenously within 2 hours before incision.

Although systemic antibiotic prophylaxis can significantly reduce CIED-related infections. Cefazolin and vancomycin have important clinical deficiencies when used as a single agent.

DETAILED DESCRIPTION OF A PREFERRED EMBODIMENT

Surprisingly, there is no clinical benefit to having a "device to stabilize" the implantable device. That is, a partially resorbable system not necessary. These prior art systems make operations to replace generators more difficult because there are more tissue to cut through. Also, the primary goal is to reduce infections. The wafer system accomplished this in a superior manner by slowly delivering therapeutic antibiotic levels in the device pocket site post-implantation and the wafer is completely resorbable making generator replacement easier.

Figure 2:
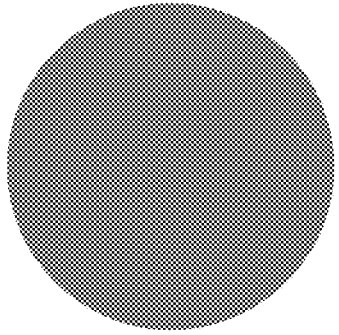
FIG. 2 is a top view of an antibiotic wafer
Figure 3:
FIG. 3 is a side view of an antibiotic wafer.

The delivery mechanism proposed is a "coin-like wafer system." FIG. 2 illustrates a top view of the wafer. FIG. 3 is a side view. The wafer system has several advantages over the prior art pouch system. The wafer system is discrete and does not take excessive volume in the pocket and around the device. Accordingly, the pocket site is significantly easier to close than the prior art pouch system. The wafers are also cheaper to manufacturer than existing system, given the simpler geometric design. The wafer has better temperature stability than the existing system, and is easier and more rapid to produce. It should become the ubiquitous system of choice.

Again, the antibiotic wafer system would be a completely (not partially) biodegradable and resorbable antibiotic impregnated wafer mesh. It would be manufactured in multiple sizes depending on the size of the implanted device: whether a defibrillator or a pacemaker implant.

The antibiotic system chosen would target predominately gram (+) bacteria and utilize bactericidal agents. These would be more effective that bacteriostatic agents.

This system would be cheaper to manufacture given its fixed geometric shape as a wafer (as opposed to a pouch)—it can be punched out of a larger sheet of constructed material. The achievable selling price should be on average $200-$300 per wafer implant—an inconsequential burden to the medical system per implant.

Consideration can be made to construct two different versions with two different antibiotic impregnation given patient antibiotic allergies.

The goal to keep costs down—sell cheaper—is paramount as pacemaker systems can cost as little at $3000-$4000 and an antibiotic system that costs up to 25% of the cost of the implantable device is not reasonable.

Ideally, this technology will be inexpensive enough to make it an indispensable addition to every implantable hardware system from pacemaker to defibrillators. It would become the STANDARD of CARE. Not using the system would be viewed as disadvantageous for the patient.

In the U.S. alone there are 275,000 de novo devices implanted every year. The infection rate for de novo implants is 1%. There are 157,000 replacement devices implanted every year. The infection rate for replacement devices is 3%. There are currently 2.92 million total devices currently existing in patients. The infection rate for existing devices is 0.8%. Nearly half-a-million device implants and generator changes are performed yearly in the United States alone.

SURGICAL WOUND ADHESIVES

There are several options for closing the surgical wound after implantation of the devices. A cyanoacrylate tissue adhesive is available which prevents microbial penetration and provides tensile strength for wound healing/closure (water resistant). Also available is a high-strength 2-octyl cyanoacrylate formulation. A high-strength 2-octyl cyanoacrylate formulation can be used. Finally, an n-butyl cyanoacrylate Antibiotic system is also suitable.

TOPICAL ANTIBIOTIC USE POST-SURGERY

Potential allergens in skin preparations include: iodine, povidone, nickel-plated devices, bacitracin, neomycin, latex, and rubber causing allergic contact dermatitis.

SURGICAL WOUND ADHESIVE WITH ANTIBIOTIC

A combination of adhesive strength of "wound adhesives" impregnated with non-cytotoxic antimicrobial agent with low-risk for local contact dermatitis is suitable for use with the system.

An antimicrobial agent such as controlled-release silver, chlorhexidine, bacitracin, mupirocin, polymyxin would be useful. Ionic silver environment is hostile to bacteria/fungi and ideal for local wound healing. There is no known antimicrobial resistance to silver and silver antimicrobial dressings are used as dressing for wound sites and catheter skin exit sites. Also useful in connection with the disclosed system is a rapid-acting, persistent and broad-spectrum antiseptic made up of 2% chlorhexidine gluconate and 70% isopropyl alcohol formulation. It acts fast and keeps fighting bacteria for at least 48 hours.

The wafer need not be any specific geometric shape. It need only be large enough so that it can provide adequate dose of antimicrobial agent to the implantation site. One preferred shape is generally circular due to the ease of manufacture and each of use with most cardiac implantable electronic devices.

The wafer is typically provided in a system made up of a sterilized and sealed in a container. In other embodiments of the system, the wafer and the implantable electronic device are both inside the sealed container.

There are at least two general forms of packaging, "dry" or "wet." In the dry packaging, the system presumable would have a relatively long shelf life but, prior to use, would need to be hydrated with the appropriate biocompatible solvent. Typical solvents are known, for example, physiological saline. A "wet" packaging is also envisioned. This embodiment would be ready to use when the package was opened but may have a shorter shelf life than the dry packaging.

What is claimed is:

1. An antimicrobial wafer system useful to prevent infections after cardiac implantable electronic device implantation, said system comprising: a wafer, an antimicrobial composition and an implantable electronic device;
   said wafer shape consisting of a planar shape and sized sufficient for covering only one side of the implantable electronic device when placed into service inside a patient's surgical wound;
   said wafer further comprising a biodegradable matrix;
   wherein said system further comprises a sealed sterile container with contents comprising said wafer and said antimicrobial composition.

2. The antimicrobial wafer system as defined in claim 1 wherein said sealed sterile container contents further comprise said implantable electronic device.

3. The antimicrobial wafer system as defined in claim 1, wherein said wafer has a generally circular shape.

4. The antimicrobial wafer system as defined in claim 1, wherein said sealed sterile container further comprises dry packaging.

5. The antimicrobial wafer system as defined in claim 1, wherein said sealed sterile container further comprises wet packaging.

6. The antimicrobial wafer system as defined in claim 1 wherein said antimicrobial composition further comprises agents selected from the group consisting of antibiotic and antifungal agents.

7. The antimicrobial wafer system as defined in claim 1 wherein said antimicrobial composition further comprises agents selected from the group consisting of controlled-release silver, chlorhexidine, bacitracin, mupirocin and polymyxin.

8. The antimicrobial wafer system as defined in claim 1 wherein said antimicrobial composition further comprises an ionic silver environment.

9. The antimicrobial wafer system as defined in claim 1 wherein said antimicrobial composition further comprises a formulation of 2% chlorhexidine gluconate and 70% isopropyl alcohol.

10. The antimicrobial wafer system as defined in claim 1 wherein the planar shape further consisting of a coin-like planar shape.

* * * * *